United States Patent
Galle et al.

(10) Patent No.: US 10,610,925 B2
(45) Date of Patent: Apr. 7, 2020

(54) CASTING MOLD AND METHODS FOR PRODUCTION

(71) Applicant: Schunk Kohlenstofftechnik GmbH, Heuchelheim (DE)

(72) Inventors: Johannes Galle, Hundsangen (DE); Milisav Markovic, Biebertal (DE)

(73) Assignee: SCHUNK KOHLENSTOFFTECHNIK GMBH, Heuchelheim (DE)

( * ) Notice: Subject to any disclaimer, the term of this patent is extended or adjusted under 35 U.S.C. 154(b) by 446 days.

(21) Appl. No.: 15/511,092

(22) PCT Filed: Sep. 8, 2015

(86) PCT No.: PCT/EP2015/070435
§ 371 (c)(1),
(2) Date: Jun. 21, 2017

(87) PCT Pub. No.: WO2016/041809
PCT Pub. Date: Mar. 24, 2016

(65) Prior Publication Data
US 2017/0341133 A1 Nov. 30, 2017

(30) Foreign Application Priority Data
Sep. 15, 2014 (DE) .......... 10 2014 218 449

(51) Int. Cl.
*B22C 9/06* (2006.01)
*B22C 3/00* (2006.01)
*B22D 11/059* (2006.01)
*C23C 16/04* (2006.01)
*C23C 16/26* (2006.01)
(Continued)

(52) U.S. Cl.
CPC .............. *B22D 11/059* (2013.01); *B22C 3/00* (2013.01); *B22C 9/061* (2013.01); *B22C 9/12* (2013.01); *B22D 15/00* (2013.01); *C23C 16/045* (2013.01); *C23C 16/26* (2013.01); *C23C 16/342* (2013.01)

(58) Field of Classification Search
CPC .............. B22C 9/06; B22C 9/061; B22C 3/00
See application file for complete search history.

(56) References Cited

U.S. PATENT DOCUMENTS 2,726,160 A * 12/1955 Ueltz .................. B22C 3/00
106/38.22
3,676,179 A 7/1972 Bokros et al.
(Continued)

FOREIGN PATENT DOCUMENTS

AT 322 128 5/1975
DE 402153 A 9/1924
(Continued)

OTHER PUBLICATIONS

EPO machine translation of AT 322128 B (Year: 1975).*
(Continued)

Primary Examiner — Kevin E Yoon
(74) Attorney, Agent, or Firm — Quarles & Brady LLP

(57) ABSTRACT

The invention relates to a method for producing a casting mold as well as to a casting mold (10), in particular a continuous casting mold or similar. Said casting mold is made of a material which is essentially made of carbon and the casting mold is coated with pyrolytic carbon and/or boron nitride.

15 Claims, 1 Drawing Sheet

(51) Int. Cl.
  *C23C 16/34* (2006.01)
  *B22C 9/12* (2006.01)
  *B22D 15/00* (2006.01)

(56) References Cited

U.S. PATENT DOCUMENTS

| | | | |
|---|---|---|---|
| 5,002,804 A | 3/1991 | Kubon et al. | |
| 2008/0118649 A1 | 5/2008 | Rathenow et al. | |
| 2010/0224755 A1* | 9/2010 | Stotzel | B22C 3/00 |
| | | | 249/114.1 |
| 2016/0024630 A1* | 1/2016 | Weber | C22F 1/14 |
| | | | 148/538 |

FOREIGN PATENT DOCUMENTS

| | | |
|---|---|---|
| DE | 1950 066 | 4/1970 |
| DE | 1571320 A1 | 1/1971 |
| DE | 88175 A1 | 11/1972 |
| DE | 226213 A1 | 8/1985 |
| DE | 3823768 A1 | 1/1990 |
| DE | 39 09 900 A1 | 10/1990 |
| DE | 40 36 893 A1 | 5/1992 |
| DE | 299 924 A7 | 5/1992 |
| DE | 198 42 660 A1 | 3/2000 |
| DE | 20 2004 009 059 | 10/2004 |
| DE | 699 22 479 | 5/2005 |
| GB | 2 171 039 | 8/1986 |
| WO | 98/16335 | 4/1998 |
| WO | 02/095080 | 11/2002 |

OTHER PUBLICATIONS

The International Search Report dated Dec. 17, 2015 for International Application No. PCT/EP2015/070435.
PCT English Language Translation of the International Preliminary Report on Patentability, PCT/EP2015/070435, dated Mar. 30, 2017.

* cited by examiner

CASTING MOLD AND METHODS FOR PRODUCTION

CROSS-REFERENCE TO RELATED APPLICATIONS

This application represents the national stage entry of PCT International Application No. PCT/EP2015/070435 filed Sep. 8, 2015 and claims priority to German Patent Application No. 10 2014 218 449.5 filed Sep. 15, 2014. The contents of these applications are hereby incorporated by reference as if set forth in their entirety herein.

The invention relates to a method for producing a casting mold for metal casting as well as a casting mold, in particular a continuous casting mold or similar, said casting mold being made of a material made essentially of carbon.

Such casting molds are sufficiently known and are used regularly for producing semi-finished products, such as rods having different cross section profiles. Such semi-finished products are produced in such a manner that metal is molten in a crucible or molten metal is filled into a crucible, an opening having a continuous casting mold being formed at the crucible. The metal, which was plasticized in the mold, is continuously pulled out of the continuous casting mold. In particular when producing semi-finished products made of non-ferrous metals having smaller cross sections, a continuous casting mold can be made entirely of a material made essentially of carbon or made entirely of carbon or graphite, respectively, a geometric form of an opening formed by the continuous casting mold corresponding to a cross section of a produced semi-finished product.

The continuous casting mold itself is made from a graphite block by machining, for example turning and milling. A disadvantage of the known continuous casting molds is that they wear comparatively quickly and have to be replaced regularly. Replacing a continuous casting mold is particularly cumbersome since a continuous casting process must be interrupted over a longer period of time in order to disassemble the continuous casting mold. The continuous casting mold made of graphite can be worn, amongst other reasons, because it becomes corroded due to the molten metal, for example. Furthermore, the molten metal or alloy components of the molten metal, respectively, can diffuse into the graphite of the continuous casting mold or into the graphite mold. Gases contained in the molten metal or gases from the process or environs, respectively, can also contribute to a quicker corrosion of the graphite mold. This results in, among other things, a surface quality and size accuracy of the produced semi-finished product deteriorating the service life of a continuous casting mold. Should a quality of a produced semi-finished product no longer be acceptable, it then becomes necessary to replace the continuous casting mold. Similar problems can occur in permanent molds made of graphite as well.

The object of the invention at hand is therefore to propose a method for producing a casting mold, a casting mold as well as a usage of such a casting mold by means of which a casting process can be conducted more cost-efficiently.

This object can be attained by a method, a casting mold and a usage of a casting mold consistent with at least some of the features described herein.

In the method according to the invention for producing a casting mold for metal casting, in particular a continuous casting mold or similar, the casting mold is made of a material made essentially of carbon, said casting mold being coated with pyrolytic carbon and/or boron nitride.

The casting mold according to the invention is entirely made of the material made essentially of carbon in such a manner that the casting mold is a body made of the material. The body comprises a porous structure, caused by the production method and a homogenous orientation of the crystal structure of the material. Hence, a surface of the body is also porous, whereby the surface is enlarged in total. Due to the porous structure, the molten metal or its components, respectively, can diffuse into the material of the casting form, said casting mold being able to easily corrode due to its enlarged surface. Since the casting mold is coated with pyrolytic carbon and/or boron nitride in the method according to the invention, pores present in the body of the casting mold can be closed or sealed by forming an additional coat or coating. The body of the casting mold made of the material can also be easily coated in a coating method using pyrolytic carbon or boron nitride, these materials comprising a high mechanic and chemical durability. A surface of the body exposed to the molten metal or gases is substantially reduced by coating them, whereby the casting mold becomes more resistant to corrosion. In particular pyrolytic carbon comprises a different degree of crystallization, in comparison to graphite for example, as well as a lower rate of oxidization and etching, whence solely the corrosion resistance is improved. A diffusion barrier is also formed with respect to the molten metal or its components, respectively, using coatings formed in this manner. A longer service life of the casting mold is obtained in this manner, whereby longer intervals, until a replacement becomes necessary, can be realized, for example, when using the casting mold as a continuous casting mold, thus leading to lower costs regarding a production process and metal casting products. Thus, the production process as a whole becomes less expensive because more metal casting products can be produced with one casting mold.

The method according to the invention can be used for producing a continuous casting mold.

However, the method is not solely limited to producing continuous casting molds since all casting molds made of a graphite body or of components made of a material essentially made of carbon can be produced using the method according to the invention. The casting mold can also be made entirely of carbon and preferably of graphite.

In an embodiment of the invention, it can be provided that the casting mold is coated with a surface coating made of pyrolytic carbon. Accordingly, the surface of the body of the casting mold can be provided with an additional surface coating applied on the surface, said surface coating covering and sealing the pores in the graphite of the body. It is also particularly advantageous for the coating to consist of pyrolytic carbon or pyrolytic graphite, respectively, since it can essentially be the same material as the material of the body of the casting mold.

Furthermore, the casting mold can be infiltrated with pyrolytic carbon, the pyrolytic carbon or the pyrolytic graphite, respectively, first infiltrating the pores in the body of the casting mold and essentially filling these entirely. The pyrolytic carbon then infiltrates the body of the casting mold only to a certain depth so that an infiltration coating of the coat or coating, respectively, is formed. The coating can then be connected even more intimately to the body of the casting mold. An infiltration itself can thus form a coat in the body or rather a coating of the body of the casting mold.

Preferably, the casting mold can be coated by means of a CVD method (chemical vapor deposition) and/or a CVI method (chemical vapor infiltration). In particular if the graphite of the casting mold is porous, the body of the casting mold can then not only be coated on the surface but also infiltrated particularly easily. It can be intended, for example, to first apply the CVI method and subsequently apply the CVD method.

Thus, when coating the casting mold or rather the body of the casting mold, pores in the graphite of the casting mold can then be filled with pyrolytic carbon. A diffusion barrier can be formed and a corrosion resistance elevated by only filling the pores.

In the method, the casting mold or rather the body of the casting mold can be coated at a temperature of 500° C. to 1900° C., preferably 600° C. to below 1700° C. It is thus possible to coat the casting mold at comparatively low temperatures, whereby the method can be conducted more easily and with less expense.

It can also be provided that, during a process time of coating the casting mold or rather the body of the casting mold, the coating is applied during a first process phase at a first temperature and subsequently during a second process phase at a second temperature, with the possibility of choosing the first process phase to be longer than the second process phase and/or with the possibility of choosing the first temperature to be lower than the second temperature. It is thus possible, for example, to infiltrate the body of the casting mold with pyrolytic carbon, for example, which can occur advantageously over a comparatively long process time at a low process temperature. An outer coating of a surface of the body of the casting mold can subsequently be brought to the second temperature level by increasing the process temperature. The second process phase being conducted at the increased process temperature can then be comparatively short. For example, coating the body of the casting mold with pyrolytic carbon can simply occur within an uninterrupted coating process.

Moreover, thermal post-processing, such as thermal processing or subsequent graphitization etc., can be omitted after applying the coating. A further step for treating the casting mold, which can also exceed the chosen process temperature, is then no longer necessary.

The casting mold according to the invention for metal casting, in particular a continuous casting mold or similar, is made of a material made essentially of carbon, said casting form being coated with pyrolytic carbon and/or boron nitride. The advantageous description of the method according to the invention is referenced regarding the advantages of a casting mold formed in such a manner.

The casting mold can be made in one piece or in several pieces. This means that a body of the casting mold, said body being made of carbon or graphite, respectively, for example, can be made in one piece, whereas the casting mold can be made of several bodies made of graphite, said bodies being able to be assembled to form one casting mold. However, the casting mold or the body of the casting mold, respectively, should not only be a casting body made of coated metal or a different raw material but rather be a three-dimensional geometric object or casting mold, respectively.

The casting mold can be formed in such a manner that a surface of the casting mold is entirely coated. Alternatively, only surface areas of the casting mold, which can come into contact with molten metal, can be coated. Surface areas of the casting mold, which do not come into contact with molten metal, needn't necessarily be coated. A method for coating the casting mold can thus be simplified if necessary.

A surface coating of the coating of the casting mold can be realized having a coating thickness of 5 μm to 500 μm, preferably 5 μm to 100 μm, and particularly preferably 5 μm to 50 μm. A surface coating concerns a coat or a coating, respectively, applied on a surface of a body of the casting mold, a perceptible effect regarding forming a diffusion barrier and an improved corrosion barrier being able to be attained by a surface coating as thin as 5 μm. It is thus not necessary to apply thicker surface coatings on the casting mold concerned.

Advantageously, a surface coating of the coating of the casting mold or rather the body of the casting mold can be made of anisotropic carbon. Thus, the solidity required for the coating can be optimized, for example, and the concerned coating can be realized comparatively thin. A corrosion resistance of the surface coating can also be improved by the anisotropic carbon.

Furthermore, an infiltration coating of the coating of the casting mold or rather the body of the casting mold can be realized having a coating thickness of at least 1 μm to 100 μm, preferably of up to 500 μm, and particularly preferably of up to 2500 μm. The infiltration coating concerns a coat or a coating, respectively, which is realized beneath the surface of the body of the casting mold and within the body. In this case, it is possible to realize a diffusion barrier with a comparatively thin infiltration coating as well as attain a perceptibly improved corrosion resistance of the body of the casting mold. Generally, however, it is advantageous to receive an infiltration coating infiltrating the body as deeply as possible.

Furthermore, it can be intended to realize an infiltration coating having finer crystals than a surface coating of the coating of the casting mold. A particularly high chemical resistance is attained by the infiltration coating having finer crystals.

The coating can have a porosity lesser than 1%, preferably lesser than 0.1%, particularly preferably of 0%. The coating can be particularly gas-proof with a porosity of essentially 0%, thus forming a very effective diffusion barrier.

Advantageously, the coating can be realized as an anti-corrosion coating. A service life of the casting mold, in particular if the casting mold is a continuous casting mold, is thus significantly increased.

Further advantageous embodiments of a casting mold can be taken from the description of features of the claims referring to method claim 1.

According to the invention, the disclosed casting mold is used for producing a casting product made of metal, the casting product being produced using the casting molding. The casting product can in particular be a semi-finished product, preferably made of non-ferrous metal.

In the following, a preferred embodiment of the invention is described by way of the attached drawing.

In the figures.

Figure 1:
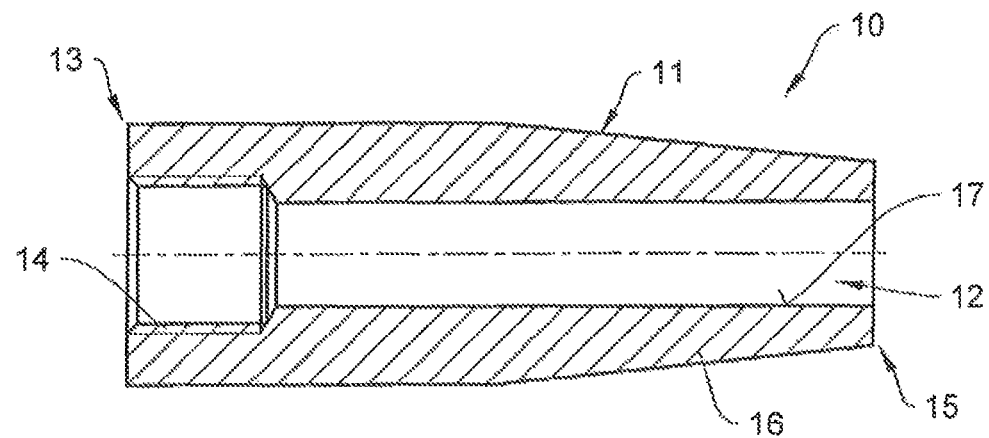
FIG. 1 shows a longitudinal section view of a continuous casting mold.

FIG. 1 shows a continuous casting mold 10 as regularly used for producing semi-finished products made of non-ferrous metals in the continuous casting process. The continuous casting mold 10 is made in one piece from a body 11 made of graphite. The body 11 is formed rotationally symmetric and has a through opening 12. At a crucible end 13 of the body 11, an inner thread 14 is formed in the through opening 13, said continuous casting mold 10 being able to be tightly mounted to a crucible, not shown, by means of the inner thread 14. A drawing end 15 of the body 11 is unattached, meaning it cannot be attached. The body 11 has a conically tapered wall 16. A surface 17 of the continuous casting mold 10 is coated in particular with pyrolytic carbon.

For producing a round bar made of non-ferrous metal such as brass or bronze, for example, not shown, molten metal now flows into the through opening 12 at the crucible end 13 and solidifies within the body 11 of the continuous casting mold so that the plasticized metal can be drawn out of the continuous casting mold 10 at the drawing end 15.

Figure 2:
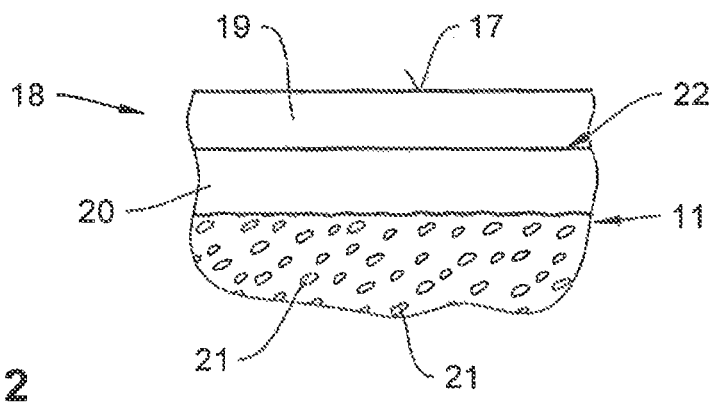
FIG. 2 shows a detailed view of a coating.

FIG. 2 shows an enlarged view of a coating 18 of the continuous casting mold 10 or rather the body 11 in the area of the surface 17. The coating 18 comprises a surface coating 19 and an infiltration coating 20. The body 11 comprises a plurality of pores 21, which would enable a diffusion of molten metal or molten components in the body 11 when uncoated. Within the infiltration coating 20, the body 11 is or rather the no longer visible pores arranged thereon are infiltrated by pyrolytic carbon as a result of a conducted coating method, with the pores essentially filled entirely. The surface coating 19 is applied on the body 11 or a surface 22 formed on the body 11 before having been coated, respectively. For this purpose, the surface coating 19 is realized anisotropic and comprises a porosity of essentially 0%. The infiltration coating 20 is realized having finer crystals with respect to the surface coating 19.

Figure 3:
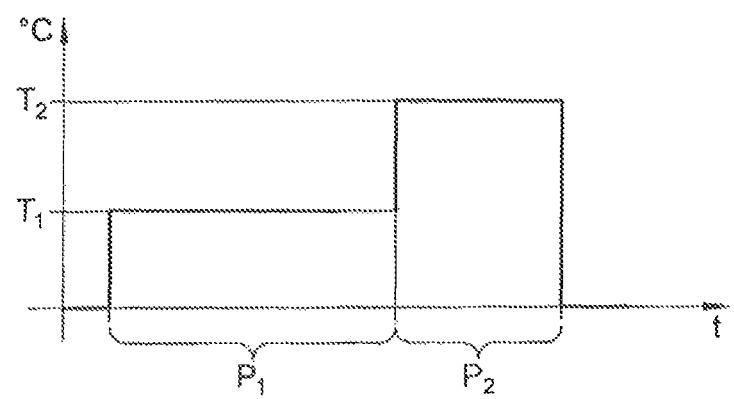
FIG. 3 shows a diagram representation of a coating process.

FIG. 3 shows a diagram of a process for coating the continuous casting mold 10. During a process time t of the coating process of the continuous coating mold 10 or rather the body 11, the temperature T1 is 600° C., for example, during a first process phase P1, a second process phase P2 taking place after the first process phase P1, a second temperature T2 of 1700° C. being applied during the second process phase P2, for example. The infiltration coating 20 is formed during the first process phase P1, the surface coating 19 being formed during the second process phase P2. The coating process is either a CVI method or a CVD method.

The invention claimed is:

1. A method for producing a casting mold for metal casting, comprising the steps of:
   producing a casting mold of a material made essentially of carbon, and
   coating the casting mold with at least one of pyrolytic carbon and boron nitride, wherein the step of coating the casting mold is performed at a temperature between 500° C. and 1900° C., wherein the step of coating the casting mold comprises the steps of applying the coating during a first process phase (P1) using a CVI method at a first temperature (T1) and subsequently applying the coating during a second process phase (P2) using a CVD method at a second temperature (T2), the first process phase being chosen to be at least one of longer than the second process phase and at a first temperature chosen to be lower than a second temperature during the second process phase.

2. The method according to claim 1, wherein the casting mold is made entirely of carbon.

3. The method according to claim 2, wherein the casting mold is made of graphite.

4. The method according to claim 3, wherein the step of coating the casting mold further comprising the step of sealing the pores in the graphite of the casting mold.

5. The method according to claim 1, wherein the step of coating the casting mold comprises coating the casting mold with a surface coating of pyrolytic carbon.

6. The method according to claim 1, further comprising the step of infiltrating the casting mold with pyrolytic carbon.

7. The method according to claim 1, wherein no thermal post-processing is performed after the step of applying the coating.

8. The method according to claim 1, wherein the step of forming said casting mold comprises applying a casting mold that comprises one or more piece.

9. The method according to claim 1, wherein the step of coating at least a portion of the casting mold comprises coating an entire surface of the casting mold.

10. The method according to claim 1, wherein the step of coating at least a portion of the casting mold comprises coating at least a portion of the casting mold to a thickness of 5 μm to 500 μm.

11. The method according to claim 1, wherein the step of coating at least a portion of the casting mold comprises applying a surface coating of the casting mold comprising anisotropic carbon.

12. The method according to claim 1, wherein the step of coating at least a portion of the casting mold comprises applying an infiltration coating, and the infiltration coating of the casting mold has a coating thickness between 1 μm and 100 μm.

13. The method according to claim 1, wherein the step of coating the casting molding comprises forming an infiltration coating of the casting mold and a surface coating of the casting mold, and wherein the infiltration coating has finer crystals than the surface coating of the casting mold.

14. The method according to according to claim 1, wherein the coating has a porosity of lesser than 1%.

15. The method according to according to claim 1, wherein the coating comprises an anti-corrosion layer.

* * * * *